(12) United States Patent
Andoh et al.

(10) Patent No.: US 7,973,543 B2
(45) Date of Patent: Jul. 5, 2011

(54) MEASUREMENT APPARATUS, TEST APPARATUS AND MEASUREMENT METHOD

(75) Inventors: Hiroki Andoh, Tokyo (JP); Kunihiro Matsuura, Tokyo (JP); Satoshi Kodera, Tokyo (JP)

(73) Assignee: Advantest Corporation, Tokyo (JP)

( * ) Notice: Subject to any disclaimer, the term of this patent is extended or adjusted under 35 U.S.C. 154(b) by 461 days.

(21) Appl. No.: 12/171,296

(22) Filed: Jul. 11, 2008

(65) Prior Publication Data
US 2010/0007327 A1    Jan. 14, 2010

(51) Int. Cl.
G01R 27/08   (2006.01)
G01R 31/26   (2006.01)

(52) U.S. Cl. .................. 324/713; 324/762.01

(58) Field of Classification Search ............... 324/76.11, 324/713, 762.01
See application file for complete search history.

(56) References Cited

U.S. PATENT DOCUMENTS

| | | | | |
|---|---|---|---|---|
| 5,574,632 A * | 11/1996 | Pansier | ............................ | 363/49 |
| 5,585,994 A * | 12/1996 | Tamai et al. | .................... | 361/98 |
| 6,552,562 B2 * | 4/2003 | Nagai et al. | ............. | 324/762.01 |
| 7,149,609 B2 * | 12/2006 | Hashimoto | ....................... | 701/1 |
| 7,557,583 B2 * | 7/2009 | Zettel et al. | ................... | 324/418 |
| 2006/0072324 A1 * | 4/2006 | Hachiya et al. | ............... | 362/270 |
| 2006/0158811 A1 * | 7/2006 | Van Den Berg | ............ | 361/93.1 |

FOREIGN PATENT DOCUMENTS

| | | |
|---|---|---|
| JP | 2007-127568 | 5/2007 |
| WO | 2005/116672 | 12/2005 |

* cited by examiner

*Primary Examiner* — Timothy J Dole
(74) *Attorney, Agent, or Firm* — Jianq Chyun IP Office (57) ABSTRACT

Provided is a measurement apparatus that measures a current flowing through a load, including a power supply section that outputs a current supplied to the load; a current measuring section that measures a load current flowing between the load and the power supply section; a switch that is connected in parallel with the current measuring section between the load and the power supply section; and a control section that disconnects the switch during measurement of the load current and connects the switch when the load current falls outside of a predetermined reference range.

10 Claims, 6 Drawing Sheets

FIG. 6 ical Field

The present invention relates to a measurement apparatus, a test apparatus, and a measurement method. In particular, the present invention relates to a measurement apparatus, a test apparatus, and a measurement method for measuring current flowing through a load.

2. Related Art

When testing a device under test such as a semiconductor circuit, a test apparatus may use a voltage application current measurement test that involves measuring the current flowing to the device under test while a DC voltage is being applied to the device under test, as in, for example, Japanese Patent Application Publication No. 2007-127568 and International Publication Pamphlet No. 2005/116672. When performing the voltage application current measurement test, the test apparatus measures the current by detecting the potential difference between the ends of a sense resistor provided between the power supply section and the device under test.

When a large current flows to the sense resistor due to excess current during the voltage application current measurement test, the potential difference between the ends of the sense resistor is increased. This causes the power supply section in the test apparatus to increase the output voltage to keep the voltage supplied to the device under test constant. However, there is a limit on the voltage that the power supply section can output. Therefore, when the output voltage of the power supply section increases due to an excess current flowing to the sense resistor during the voltage application current measurement test, the output voltage of the power supply section might reach its maximum value. When this happens, the test apparatus cannot continue to supply the constant voltage to the device under test.

One way to solve this problem involves connecting forward diodes in parallel with the sense resistor to limit the potential difference between the ends of the sense resistor. In this way, the test apparatus can control the output voltage of the power supply section to not reach the maximum value. However, since this test apparatus includes the forward diodes connected in parallel with the sense resistor, the circuit size is undesirably large.

Furthermore, with this test apparatus, connecting the diodes to the sense resistor at a plurality of stages increases the voltage tolerance, making it necessary for the current leaked to the diodes during measurement of the current to be decreased. However, such a test apparatus is electrically inefficient because it must be provided with a power supply section in which the voltage allowance (headroom) between the voltage applied to the device under test and the maximum voltage of the power supply section is larger than at least the voltage decrease at the diodes.

SUMMARY

Therefore, it is an object of an aspect of the innovations herein to provide a measurement apparatus, a test apparatus, and a measurement method, which are capable of overcoming the above drawbacks accompanying the related art. The above and other objects can be achieved by combinations described in the independent claims. The dependent claims define further advantageous and exemplary combinations of the innovations herein.

According to a first aspect related to the innovations herein, one exemplary measurement apparatus may include a measurement apparatus that measures a current flowing through a load, including a power supply section that outputs a current supplied to the load, a current measuring section that measures a load current flowing between the load and the power supply section, a switch that is connected in parallel with the current measuring section between the load and the power supply section, and a control section that disconnects the switch during measurement of the load current and connects the switch when the load current falls outside of a predetermined reference range.

According to a second aspect related to the innovations herein, one exemplary test apparatus may include a test apparatus that measures a current flowing to an electronic device, including a power supply section that outputs a current supplied to the electronic device, a current measuring section that measures a load current flowing between the electronic device and the power supply section, a switch that is connected in parallel with the current measuring section between the electronic device and the power supply section, and a control section that disconnects the switch during measurement of the load current and connects the switch when the load current falls outside of a predetermined reference range.

According to a first aspect related to the innovations herein, one exemplary measurement method may include a measurement method performed by a measurement apparatus for measuring a current flowing through a load. In the measurement method, the measurement apparatus includes a power supply section that outputs a current supplied to the load, a current measuring section that measures a load current flowing between the load and the power supply section, and a switch that is connected in parallel with the current measuring section between the load and the power supply section. The switch is disconnected during measurement of the load current and the switch is connected when the load current falls outside of a predetermined reference range.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
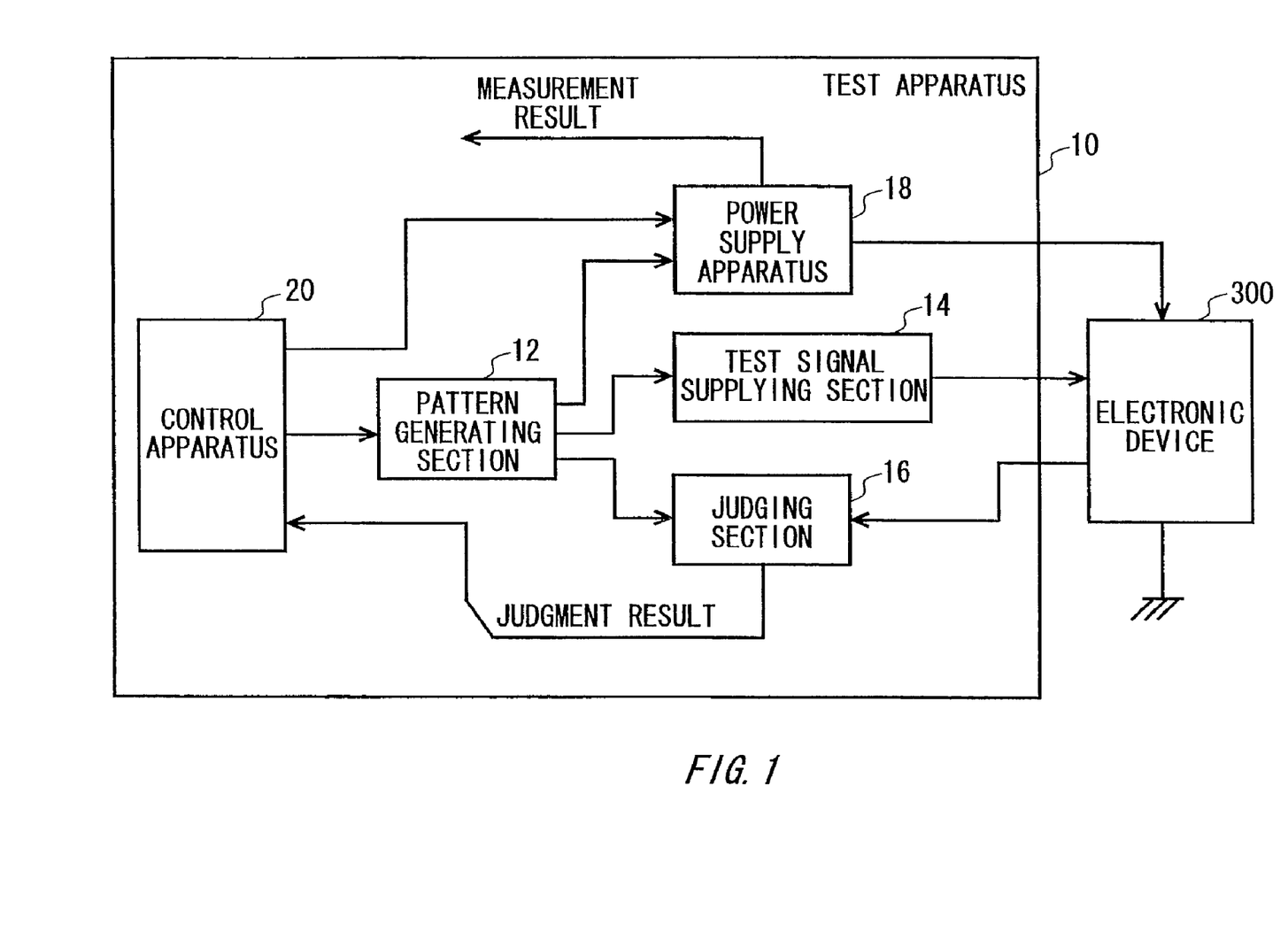
FIG. 1 shows a configuration of a test apparatus 10 according to an embodiment, along with an electronic device 300.

FIG. 1 shows a configuration of a test apparatus 10 according to an embodiment, along with an electronic device 300. The test apparatus 10 tests the electronic device 300 such as a semiconductor circuit. For example, the test apparatus 10 can perform a voltage application current measurement test by applying a DC voltage to the electronic device 300 and measuring the current flowing through the electronic device 300.

The test apparatus 10 is provided with a pattern generating section 12, a test signal supplying section 14, a judging section 16, a power supply apparatus 18, and a control apparatus 20. The pattern generating section 12 generates a pattern indicating a waveform or the like of the test signal applied to the electronic device 300. The test signal supplying section 14 supplies the electronic device 300 with the test signal having the waveform corresponding to the pattern generated by the pattern generating section 12. The judging section 16 receives a response signal output by the electronic device 300 in response to the supplied test signal. The judging section 16 judges pass/fail of the electronic device 300 by comparing the received response signal to an expected value corresponding to the pattern generated by the pattern generating section 12.

The power supply apparatus 18 supplies the electronic device 300 with a power supply voltage. The power supply apparatus 18 also functions as a measurement apparatus that measures the current flowing through the electronic device 300. For example, the power supply apparatus 18 functions as the measurement apparatus during the voltage application current measurement test. The control apparatus 20 performs overall control of the test apparatus 10. The control apparatus 20 may control the operations of the pattern generating section 12 and the power supply apparatus 18.

Figure 2:
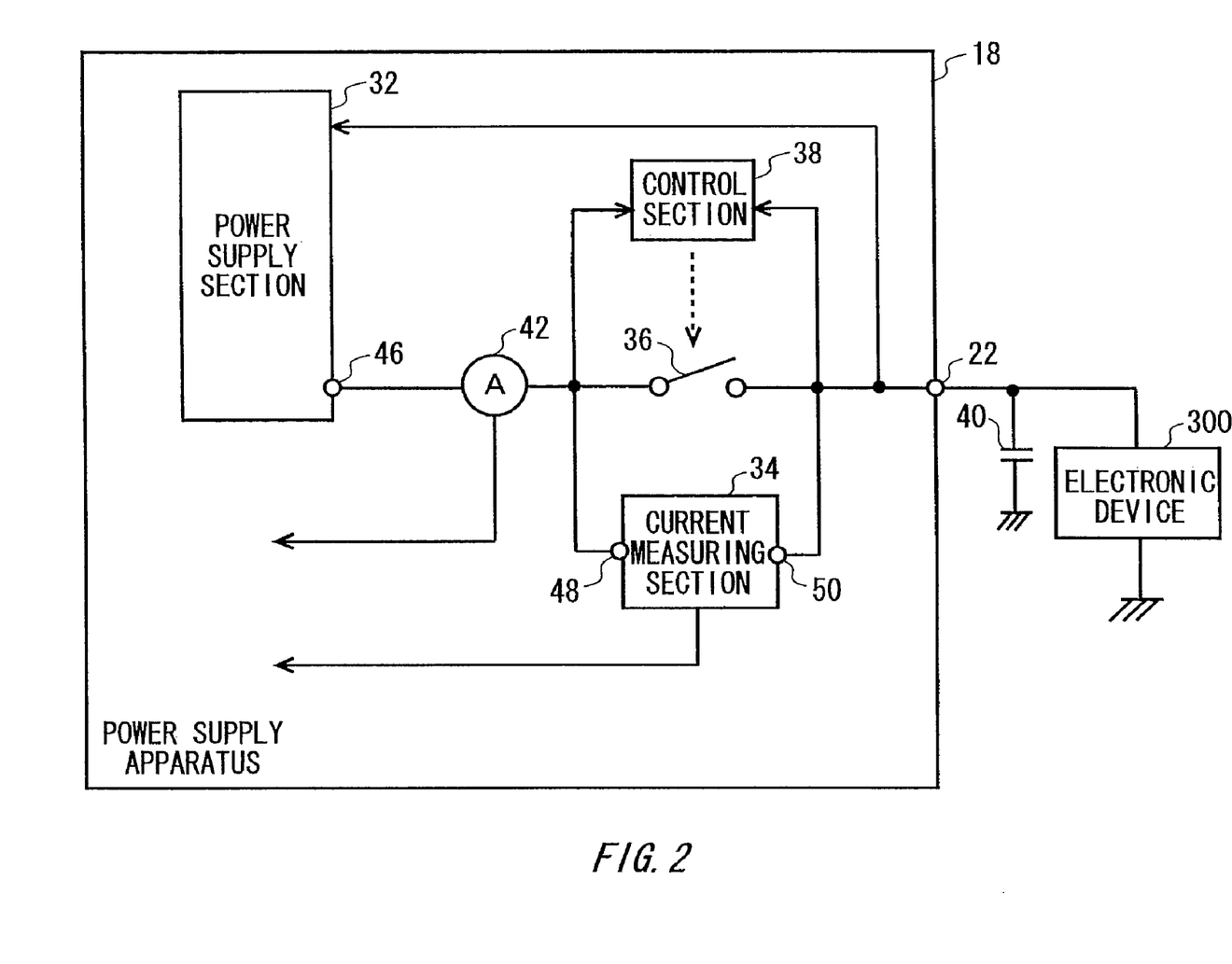
FIG. 2 shows a configuration of the power supply apparatus 18 according to the present embodiment, along with the electronic device 300.

FIG. 2 shows a configuration of the power supply apparatus 18 according to the present embodiment, along with the electronic device 300. The power supply apparatus 18 generates, from the apparatus output end 22, a power supply voltage having a direct current stabilized at a designated value and applies this power supply voltage to the electronic device 300, which is an example of the load. The power supply apparatus 18 also functions as a measurement apparatus that measures the load current flowing between the apparatus output end 22 and the electronic device 300.

The power supply apparatus 18 includes a power supply section 32, a current measuring section 34, a switch 36, a control section 38, and a large current measuring section 42. The power supply section 32 outputs the current supplied to the electronic device 300. The power supply section 32 of the present embodiment generates the power supply voltage stabilized at a value designated by the voltage value of the apparatus output end 22, from a power supply section end 46 connected to the apparatus output end 22. More specifically, the power supply section 32 detects the voltage of the apparatus output end 22 and generates, from the power supply section end 46, a power supply voltage adjusted to be equal to the reference voltage designated by the detected voltage of the apparatus output end 22.

The current measuring section 34 measures the load current flowing between the electronic device 300 and the power supply section 32. More specifically, the current measuring section 34 measures the current that is input into the wiring connecting the power supply section end 46 and the apparatus output end 22 to flow therebetween.

The switch 36 is connected in parallel with the current measuring section between the electronic device 300 and the power supply section 32. More specifically, the switch 36 is connected between a power supply section side terminal 48 of the current measuring section 34, which is connected to a power supply section end 46, and a device side terminal 50 of the current measuring section 34, which is connected to the apparatus output end 22. The switch 36 provides a connection or a disconnect between the power supply section side terminal 48 and the device side terminal 50.

The control section 38 controls whether the switch 36 is connected or disconnected. More specifically, the control section 38 disconnects the switch 36 when measuring the load current with the current measuring section 34. The control section 38 connects the switch 36 when the load current is outside of a predetermined reference range during measurement of the load current by the current measuring section 34.

The predetermined reference range may be a range of the load current, such as a range of the voltages between the ends of the current measuring section 34, extending from (i) a potential difference between the maximum voltage outputtable by the power supply section 32 and the voltage to be output by the apparatus output end 22 to (ii) a potential difference between the minimum voltage outputtable by the power supply section 32 and the voltage to be output by the apparatus output end 22. The load current is determined to be outside of the reference range when, for example, the current flowing from the power supply section 32 to the electronic device 300 is greater than a predetermined value or the current flowing from the electronic device 300 to the power supply section 32 is greater than a predetermined value.

The large current measuring section 42 measures the load current flowing between the electronic device 300 and the power supply section 32. More specifically, the current measuring section 34 measures the current that is input into the wiring connecting the power supply section end 46 and the apparatus output end 22 to flow therebetween. The large current measuring section 42 may be connected in parallel with the current measuring section 34, and may have a measurement range that is wider than that of the current measuring section 34. The large current measuring section 42 may measure the current supplied to the electronic device 300 during functional testing of the electronic device 300.

The current measuring section 34 measures the load current flowing between the electronic device 300 and the power supply section 32. More specifically, the current measuring section 34 measures the current that is input into the wiring connecting the power supply section end 46 and the apparatus output end 22 to flow therebetween.

The power supply apparatus 18 disconnects the switch 36 when the current measuring section 34 measures the load current. By doing this, the power supply apparatus 18 can supply the electronic device 300 with the power supply voltage while using the current measuring section 34 to measure the load current supplied to the electronic device 300.

The power supply apparatus 18 connects the switch 36 when the load current is outside of the predetermined reference range during measurement of the load current by the current measuring section 34. By doing this, the power supply apparatus 18 can cut off the supply of the power supply voltage to the electronic device 300, even if the measurement is interrupted due to the load current being outside of the reference range.

The test apparatus 10 may be provided with a capacitor 40 in parallel with the electronic device 300 at a position near the electronic device 300. The capacitor 40 may connect a power supply terminal of the electronic device 300 to a ground. The capacitor 40 can act in place of the power supply section 32 to supply the electronic device 300 with the current when a delay occurs in the generation of the power supply voltage by the power supply section 32 in response to a fluctuation in the impedance of the electronic device 300. The power supply apparatus 18 may further include a capacitor between the apparatus output end 22 and the ground.

Figure 3:
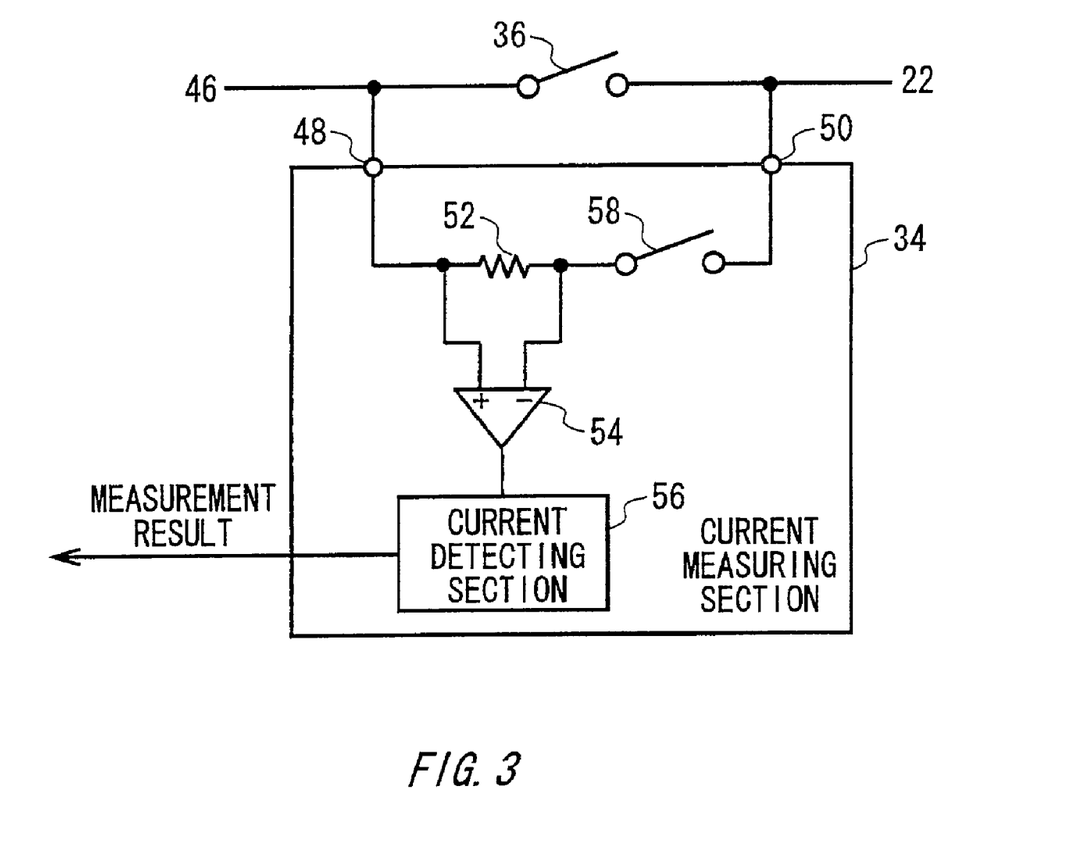
FIG. 3 shows an exemplary configuration of the current measuring section 34, along with the switch 36.

FIG. 3 shows an exemplary configuration of the current measuring section 34, along with the switch 36. The current measuring section 34 may include a sense resistor 52, a first potential difference detecting section 54, a current detecting section 56, and an internal switch 58.

The sense resistor 52 has a predetermined resistance value, and is connected in parallel with the switch 36 between the electronic device 300 and the power supply section 32. More specifically, the sense resistor 52 is inserted into the wiring between the power supply section side terminal 48 and the device side terminal 50.

The first potential difference detecting section 54 detects the potential difference between the ends of the sense resistor 52. The first potential difference detecting section 54 may be a differential amplifier that generates a voltage corresponding to the potential difference between the ends of the sense resistor 52.

The current detecting section 56 detects the load current based on the potential difference detected by the first potential difference detecting section 54. For example, the current detecting section 56 acquires digital data corresponding to the load current by AD converting the potential difference between the ends of the sense resistor 52. The current detecting section 56 may calculate the load current by dividing this digital data by the resistance value of the sense resistor 52. The current detecting section 56 outputs data or a signal expressing the value of the detected load current, as a measurement result.

The internal switch 58 is provided in parallel with the sense resistor 52 in the wiring between the power supply section side terminal 48 and the device side terminal 50, and provides a connection or a disconnect to the sense resistor 52 between the power supply section side terminal 48 and the device side terminal 50. The internal switch 58 is connected when the current measuring section 34 measures the load current, and is disconnected when the current measuring section 34 is not measuring the load current.

Figure 4:
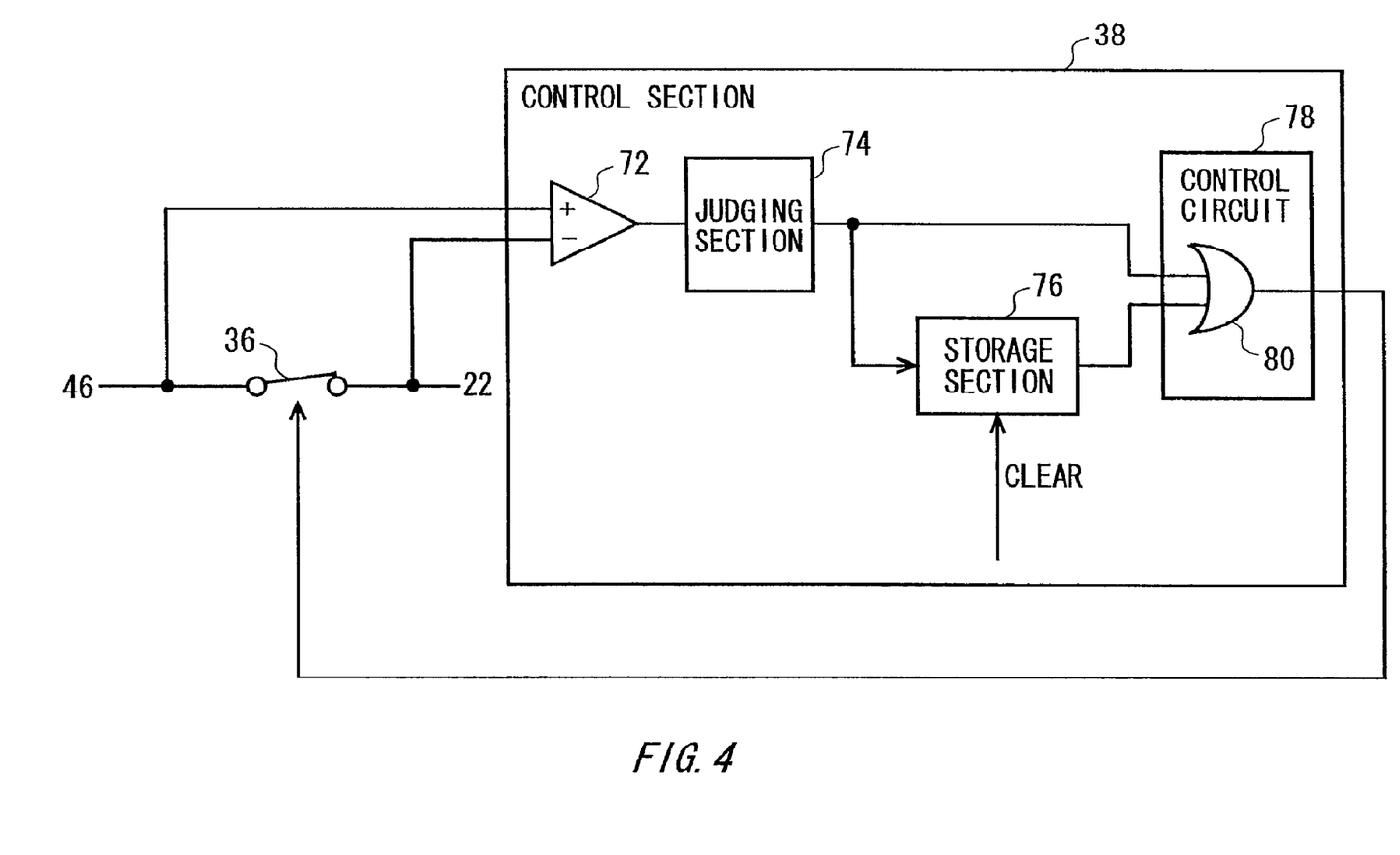
FIG. 4 shows an exemplary configuration of the control section 38, along with the switch 36.

FIG. 4 shows an exemplary configuration of the control section 38, along with the switch 36. The control section 38 may include a second potential difference detecting section 72, a judging section 74, a storage section 76, and a control circuit 78.

The second potential difference detecting section 72 detects the potential difference between the ends of the sense resistor 52 shown in FIG. 3, which is the potential difference between the ends of the switch 36, during measurement of the load current by the current measuring section 34. The second potential difference detecting section 72 may be a differential amplifier that generates a voltage corresponding to the potential difference between the ends of the switch 36, which is the potential difference between the ends of the sense resistor 52.

The judging section 74 judges whether the potential difference detected by the second potential difference detecting section 72 is within a voltage range designated in accordance with the reference range. The judging section 74 outputs a judgment signal that is Logic H when the potential difference detected by the second potential difference detecting section 72 is outside of the voltage range and Logic L when the potential difference detected by the second potential difference detecting section 72 is within the voltage range.

When the judging section 74 judges that the load current is outside of the reference range during measurement of the load current by the current measuring section 34, the storage section 76 stores detection information indicating that the measurement of the load current has failed. The storage section 76 clears the stored detection information upon receiving clear instructions from the control apparatus 20.

The control circuit 78 connects the switch 36 when the judging section 74 judges that the potential difference is outside of the voltage range during measurement of the load current by the current measuring section 34. The control circuit 78 keeps the switch 36 connected while the storage section 76 stores the detection information during a prescribed period of measurement of the load current by the current measuring section 34, lasting until the detection information is cleared.

The control circuit 78 includes an OR circuit 80. The OR circuit 80 calculates the OR of the judgment signal output by the judging section 74 and the stored content, which becomes logic H when the detection information is stored, output by the storage section 76. When the OR calculated by the OR circuit 80 is logic H, the control circuit 78 connects the switch 36. The control section 38 with this configuration can keep the switch 36 connected from a time when the load current falls outside of the reference range during measurement of the load current by the current measuring section 34 until a time when the storage section 76 is cleared.

In the control section 38 having this configuration, the second potential difference detecting section 72 desirably operates at a speed higher than the speed at which the output voltage responds to the fluctuation in the feedback voltage in the power supply section 32. In this way, when the load current falls outside of the reference range, the second potential difference detecting section 72 can connect the switch 36 before the output voltage of the power supply section 32 reaches the maximum value, so that the supply of the power supply voltage to the electronic device 300 can continue without interruption. The second potential difference detecting section 72 desirably operates at a higher speed than the first potential difference detecting section 54. For example, if the second potential difference detecting section 72 and the first potential difference detecting section 54 are both differential amplifiers, the response speed of the second potential difference detecting section 72 is desirably higher than the response speed of the first potential difference detecting section 54. By doing this, the second potential difference detecting section 72 can quickly connect the switch 36 when the load current falls outside of the reference range.

The first potential difference detecting section 54 detects the potential difference with an accuracy that fulfills the specifications of the measurement function in the voltage application current measurement test. The first potential difference detecting section 54 may detect the potential difference more accurately than the second potential difference detecting section 72. For example, if the second potential difference detecting section 72 and the first potential difference detecting section 54 are both differential amplifiers, the first potential difference detecting section 54 may have a higher degree of accuracy than the second potential difference detecting section 72, so that the potential difference detecting section 54 can more accurately measure the load current. The first potential difference detecting section 54 and the second potential difference detecting section 72 may be realized as a single differential amplifier that fulfills the specifications of the measurement function in the voltage application current measurement test and has a sufficiently high-speed response.

As described above, the power supply apparatus 18 connects the switch 36 when the load current falls outside the reference range during measurement of the load current by the current measuring section 34, so that the supply of the power supply voltage to the electronic device 300 can continue. By using the power supply apparatus 18 in this way, the output voltage of the power supply section 32 can be controlled to not reach a maximum value, without increasing the size of the circuit. Furthermore, by using this power supply apparatus 18, a circuit such as a diode is not provided between the power supply section end 46 and the apparatus output end 22. Therefore, the voltage allowance (headroom) between the voltage to be output by the apparatus output end 22 and the maximum voltage of the power supply section 32 is decreased, so that the power consumed by the power supply section 32 is also decreased.

Figure 5:
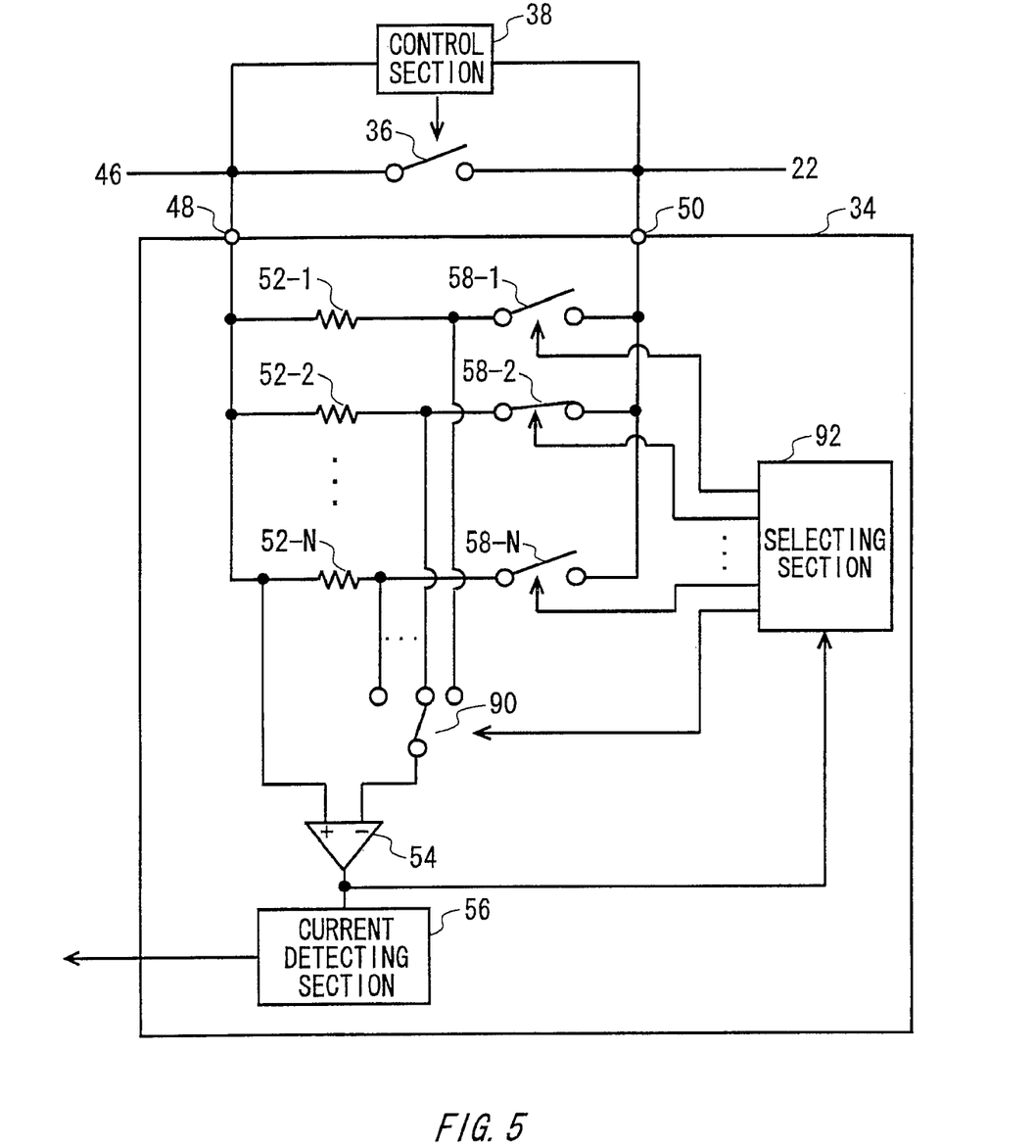
FIG. 5 shows a configuration of the current measuring section 34 according to a modification of the present embodiment, along with the switch 36 and the control section 38.

FIG. 5 shows a configuration of the current measuring section 34 according to a modification of the present embodiment, along with the switch 36 and the control section 38. The current measuring section 34 of the present modification adopts substantially the same function and configuration as the current measuring section 34 shown in FIG. 3, and therefore components having substantially the same function and configuration as components of the current measuring section 34 shown in FIG. 3 are given the same reference numerals, and the following description includes only differing points.

The current measuring section 34 of the present modification includes a plurality of sense resistors 52-1 to 52-N, the first potential difference detecting section 54, the current detecting section 56, a plurality of internal switches 58-1 to 58-N, a selecting switch 90, and a selecting section 92.

Each of the plurality of sense resistors 52 is provided in parallel with the switch 36 between the electronic device 300 and the power supply section 32, and one of these sense resistors 52 is selected to be connected. Each sense resistor 52 has a predetermined resistance value different than that of the other sense resistors 52.

The selecting switch 90 supplies the first potential difference detecting section 54 with the potential difference between the ends of one sense resistor 52 selected from among the plurality of sense resistors 52. The first potential difference detecting section 54 detects the potential difference between the ends of the sense resistor 52 from among the plurality of sense resistors 52 that is connected between the electronic device 300 and the power supply section 32.

Each of the plurality of internal switches 58 is disposed to correspond to one of the plurality of sense resistors 52. Each internal switch 58 is connected when the corresponding sense resistor 52 is connected, to connect the corresponding sense resistor 52 between the electronic device 300 and the power supply section 32 during measurement of the load current by the current measuring section 34.

The selecting section 92 selects which of the sense resistors 52 to connect between the electronic device 300 and the power supply section 32 based on the potential difference detected by the first potential difference detecting section 54. For example, the selecting section 92 selects a sense resistor 52 having a resistance that causes the potential difference between the ends of the sense resistor 52 to be within the predetermined voltage range, such as a voltage range that can be input to the first potential difference detecting section 54, and connects the selected sense resistor 52 between the electronic device 300 and the power supply section 32.

Figure 6:
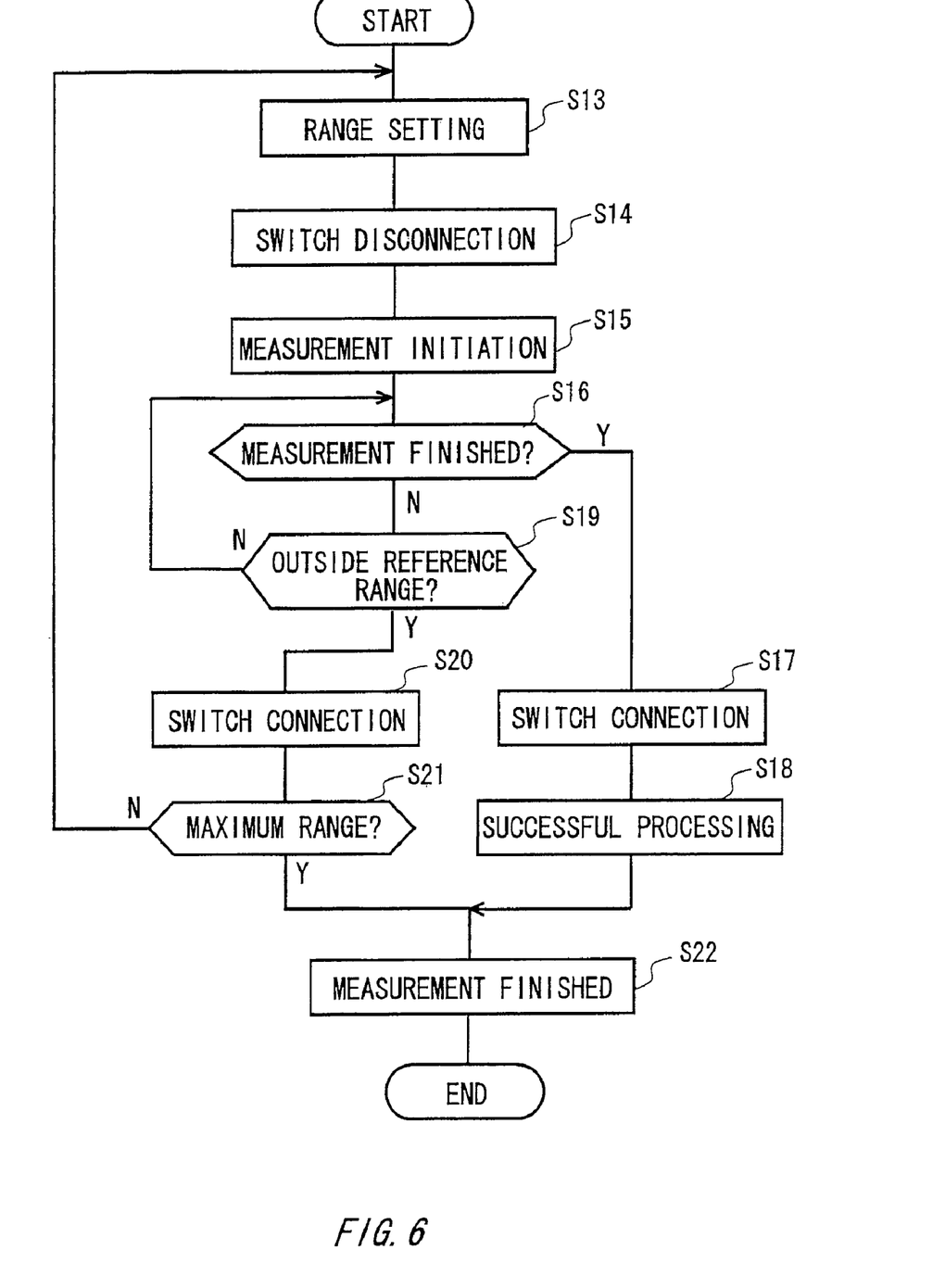
FIG. 6 shows a process flow of the power supply apparatus 18 according to the modification.

FIG. 6 shows a process flow of the power supply apparatus 18. The power supply apparatus 18 may receive instructions for beginning measurement of the load current by the current measuring section 34 from the control apparatus 20 or the like, as a result of the test apparatus 10 performing the voltage application current measurement test or the like.

Upon receiving the instructions for beginning measurement of the load current, the selecting section 92 sets the measurement range of the load current, selects one sense resistor 52 according to the set measurement range, and connects the selected sense resistor 52 between the electronic device 300 and the power supply section 32 (step S13). Before initiating the measurement of the load current, the control section 38 disconnects the switch 36 (step S14). By doing this, the control section 38 can cause the load current flowing between the power supply section end 46 and the electronic device 300 to flow to the selected sense resistor 52 in the current measuring section 34.

The current measuring section 34 initiates measurement of the load current (step S15). When initiating measurement of the load current, the current measuring section 34 outputs a measurement result indicating the value of the load current to the outside.

The control section 38 judges whether instructions for ending the measurement have been received during the measurement of the load current (step S16). If instructions for ending the measurement have been received (the "Yes" of step S16), the control section 38 connects the switch 36 (step S17). By doing this, the control section 38 can continue the supply of the supply power voltage to the electronic device 300 from here on after. The current measuring section 34 performs a process dependant on the successful measurement of the load current, such as providing notification of the successful measurement (step S18).

If instructions for ending the measurement have not been received (the "No" of step S16), the control section 38 judges whether the load current is outside the reference range (step S19). If the load current is not outside of the reference range (the "No" of step S19), the control section 38 repeats the processes of step S16 and step S19.

If the load current is outside of the reference range (the "Yes" of step S19), the control section 38 connects the switch 36 (step S20). By doing this, the control section 38 can avoid interrupting the supply of the constant voltage to the electronic device 300 caused by the output voltage of the power supply section 32 reaching the maximum value.

When the load current is outside of the reference range, the control section 38 judges whether the maximum measurement range is set, in other words, whether the sense resistor 52 having the smallest resistance value is selected (step S21). If the maximum measurement range is not set (the "No" of step S21), the control section 38 keeps the switch 36 connected for a predetermined period of time from when the load current falls outside of the reference range, and, after this predetermined period, returns to the process at step S13 to repeat the measurement range setting.

When resetting the measurement range (step S13), the control section 38 may enlarge the measurement range. In other words, the control section 38 may select a sense resistor 52 that has a resistance value larger than that of the sense resistor 52 that caused the load current to fall outside of the reference range. In this way, the control section 38 can automatically switch to the most appropriate measurement range. As an alternative, the control section 38 may reset the measurement range to be equal to the measurement range used when the load current fell outside of the reference range. In this way, the power supply apparatus 18 can continue the measurement process even if the load current temporarily falls outside the reference range, as long the load current later returns to be within the reference range.

When the process at step S18 ends or when the judgment is made at step S21 that the maximum measurement range is set (the "Yes" of step S21), the measurement of the load current by the current measuring section 34 ends (step S22). In the manner described above, the power supply apparatus 18 continues supplying the power supply voltage to the electronic device 300 by connecting the switch 36 when the load current falls outside of the reference range during measurement of the load current by the current measuring section 34. Therefore, when performing a subsequent test or repeating the measurement of the load current after changing the measurement range, the power supply apparatus 18 can avoid stoppage of the supply of the constant current to the electronic device 300 caused by the output voltage of the power supply section 32 reaching the maximum value.

The control circuit 78 of the control section 38 may connect the switch 36 when the judging section 74 judges that the potential difference falls outside of the voltage range and the sense resistor 52 having the lowest resistance value from among the plurality of sense resistors 52 is connected between the electronic device 300 and the power supply section 32. In this way, the control circuit 78 can judge that the load current falls outside of the reference range that is measurable by the current measuring section 34 and accordingly connect the switch 36, only when the load current falls outside the measurement range set to the maximum value.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

What is claimed is:

1. A measurement apparatus that measures a current flowing through a load, comprising:
    a power supply section that outputs a current supplied to the load;
    a current measuring section that measures a load current flowing between the load and the power supply section;
    a switch that is connected in parallel with the current measuring section between the load and the power supply section; and
    a control section that disconnects the switch during measurement of the load current and connects the switch when the load current falls outside of a predetermined reference range, wherein
    the current measuring section includes:
        a sense resistor that is connected in parallel with the switch between the load and the power supply section;
        a first potential difference detecting section that detects a potential difference between ends of the sense resistor; and
        a current detecting section that detects the load current based on the potential difference detected by the first potential difference detecting section, and
    the control section includes:
        a second potential difference detecting section that detects a potential difference between ends of the switch;
        a judging section that judges whether the potential difference detected by the second potential difference detecting section is within a voltage range set according to the reference range; and
        a control circuit that connects the switch when the judging section judges that the potential difference is outside of the voltage range.

2. The measurement apparatus according to claim 1, wherein the control circuit
    keeps the switch connected during at least a portion of a period lasting from when power is supplied to the load to when the load current falls within the reference range, and
    keeps the switch disconnected prior to initiation of the measurement of the load current.

3. The measurement apparatus according to claim 1, wherein
    the control section further includes a storage section that stores detection information indicating that the load current has fallen outside of the reference range, and
    the control circuit keeps the switch connected until the detection information is cleared, when the detection information is stored in the storage section during measurement of the load current.

4. The measurement apparatus according to claim 3, wherein
    the control circuit connects the switch when an OR of (i) a judgment signal, output by the judging section, that is logic H when the potential difference falls outside of the voltage range and (ii) stored content, output by the storage section, that is logic H when the detection information is stored, is logic H.

5. The measurement apparatus according to claim 1, wherein the current measuring section includes:
    a plurality of sense resistors that have different resistance values from each other, one of the plurality of sense resistors being selected to be connected in parallel with the switch between the load and the power supply section;
    a first potential difference detecting section that detects a potential difference between ends of the sense resistor connected between the load and the power supply section;
    a selecting section that selects one of the plurality of sense resistor to be connected between the load and the power supply section according to the potential difference detected by the first potential difference detecting section; and
    a current detecting section that detects the load current based on the potential difference detected by the first potential difference detecting section.

6. The measurement apparatus according to claim 1, wherein
    the control circuit keeps the switch connected during a predetermined period from when the load current falls outside of the reference range.

7. The measurement apparatus according to claim 1, wherein
    the second potential difference detecting section operates at a higher speed than the first potential difference detecting section.

8. The measurement apparatus according to claim 1, wherein
    the first potential difference detecting section detects the potential difference more accurately than the second potential difference detecting section.

9. A test apparatus that measures a current flowing to an electronic device, comprising:
    a power supply section that outputs a current supplied to the electronic device;
    a current measuring section that measures a load current flowing between the electronic device and the power supply section;
    a switch that is connected in parallel with the current measuring section between the electronic device and the power supply section; and a control section that disconnects the switch during measurement of the load current and connects the switch when the load current falls outside of a predetermined reference range, wherein the current measuring section includes:

a sense resistor that is connected in parallel with the switch between the electronic device and the power supply section;

a first potential difference detecting section that detects a potential difference between ends of the sense resistor; and a current detecting section that detects the load current based on the potential difference detected by the first potential difference detecting section, and the control section includes:

a second potential difference detecting section that detects a potential difference between ends of the switch;

a judging section that judges whether the potential difference detected by the second potential difference detecting section is within a voltage range set according to the reference range; and a control circuit that connects the switch when the judging section judges that the potential difference is outside of the voltage range.

10. A measurement method performed by a measurement apparatus for measuring a current flowing through a load, wherein the measurement apparatus comprises:

a power supply section that outputs a current supplied to the load;

a current measuring section that measures a load current flowing between the load and the power supply section; and a switch that is connected in parallel with the current measuring section between the load and the power supply section, wherein the current measuring section includes:

a sense resistor that is connected in parallel with the switch between the load and the power supply section;

a first potential difference detecting section that detects a potential difference between ends of the sense resistor;

a current detecting section that detects the load current based on the potential difference detected by the first potential difference detecting section, and the measurement method comprises:

disconnecting the switch during measurement of the load current;

detecting a potential difference between ends of the switch;

judging whether the potential difference is within a voltage range set according to a predetermined reference range of load current; and connecting the switch when the load current falls outside of the predetermined reference range or the potential difference is outside of the voltage range.

* * * * *